United States Patent [19]

Adams et al.

[11] Patent Number: 4,675,612
[45] Date of Patent: Jun. 23, 1987

[54] APPARATUS FOR SYNCHRONIZATION OF A FIRST SIGNAL WITH A SECOND SIGNAL

[75] Inventors: Neil R. Adams, San Francisco, Calif.; Craig S. K. Clapp, Lynn, Mass.

[73] Assignee: Advanced Micro Devices, Inc., Sunnyvale, Calif.

[21] Appl. No.: 747,476

[22] Filed: Jun. 21, 1985

[51] Int. Cl.[4] .............................................. H03L 7/00
[52] U.S. Cl. ......................................... 328/63; 328/55
[58] Field of Search ...................... 328/63, 155, 66, 72, 328/75, 109, 55, 56; 307/279, 590, 600, 606, 480; 377/43, 78

[56] References Cited

U.S. PATENT DOCUMENTS

| | | | |
|---|---|---|---|
| 3,502,991 | 3/1970 | Sampson | 307/606 |
| 3,588,707 | 6/1971 | Manship | 328/72 |
| 4,011,516 | 3/1977 | Heimbigner | 328/155 |
| 4,023,110 | 5/1977 | Oliver | 328/109 |
| 4,386,323 | 5/1983 | Jansen | 328/63 |

FOREIGN PATENT DOCUMENTS 1140237  2/1985  U.S.S.R. ................. 328/55

*Primary Examiner*—Stanley D. Miller
*Assistant Examiner*—K. Ohralik
*Attorney, Agent, or Firm*—Patrick T. King; Mark A. Haynes; J. Vincent Tortolano

[57] ABSTRACT

Disclosed is an apparatus for synchronizing a first signal with a second signal comprising a plurality of delay means $D_i$ as i goes from 1 to N, where N is an integer, each delay means $D_i$ having an input $I_i$ and a delay output $O_i$ for delaying a signal received at the respective input $I_i$ by an increment $\delta t$ of time in supplying the delayed signal at the respective delay output $O_i$. The first delay means $D_1$ of the plurality of delay means is connected to receive the first signal at its input $I_1$. Each of the other delay means $D_i$, for i equal to 2 to N, are connected in series such that the respective input $I_i$ is connected to receive the delay output $O_{i-1}$ of the preceding delay means $D_{i-1}$. A plurality of latch means $L_i$, as i goes from 1 to N, are connected to be clocked by the second signal. Each of the latch means $L_i$ latches the signal at the delay output $O_i$ respectively for each of the delay means $D_i$, in response to the second signal and supplies the latched signal at a respective latch output $Q_i$. Output logic means, responsive to at least a subset of the plurality of delay outputs $O_i$ and plurality of latch outputs $Q_i$, for supplying essentially a phase-shifted copy of the first signal synchronized with the second signal is provided.

9 Claims, 4 Drawing Figures

APPARATUS FOR SYNCHRONIZATION OF A FIRST SIGNAL WITH A SECOND SIGNAL

FIELD OF THE INVENTION

The present invention relates to the synchronization of a first signal, such as a clock, with a second signal, such as an asynchronous external signal. The present invention has particular applicability in the field of synchronization of high-frequency clocks with asynchronous external signals.

BACKGROUND OF THE INVENTION

In many applications it is necessary to synchronize an arbitrary first signal to a phase reference, such as an independently supplied second signal. In some cases this independently supplied second signal is a single "one-shot" signal, or occurs infrequently relative to the frequency of the first signal. For example, a high-speed video dot clock used in a high-resolution digital CRT display needs to be synchronized to the start of each video line. The start of each video line is identified by a line sync signal. However, this line sync signal may repeat only once for every thousand cycles of the video dot clock. Thus, for pratical purposes, the line sync signal in this example is effectively an asynchronous single event.

The prior art accomplishes synchronization of a first signal with a second signal typically by one of two techniques. The first technique involves the use of a local clock having a frequency that is a large multiple of the frequency of the first signal, or clock, to be synchronized. The high-frequency multiple is supplied to a divider which is reset by the occurrence of the synchronizing second signal. The problem with this technique is the necessity of using a local clock having a much higher frequency than the frequency of the clock signal to be synchronized. Thus, for very high data frequencies, the cost of a local clock operating at large multiples of that high data frequency becomes prohibitive.

The second technique is the phase-locked loop frequency multiplier often used for systems having regularly spaced synchronizing signals. The phase-locked loop frequency multiplier operates by the use of a phase detector which detects the phase of the output of a divider that divides the frequency of the clock to be synchronized to match the frequency of the synchronizing signal and compares the divided output with the phase of the synchronizing signal. A phase correction signal is generated and supplied to a voltage-controlled oscillator which adjusts the clock to be synchronized to match the synchronizing signal. The clock signal output of the voltage-controlled oscillator is supplied to the divider which is fed back to the phase detector for comparison again with the synchronizing signal. Problems with phase-locked loop systems include the fact that it takes several synchronizing events for the phase-locked loop to lock up on the correct frequency. Also, phase-locked loops suffer stability problems when there are irregular or infrequent synchronizing events with respect to the frequency of the clock to be synchronized. In the high-frequency video dot clock example, discussed above, or other systems where the occurrence of the synchronizing signal might be considered an irregular or infrequent event, the phase-locked loop would be severely prone to degradation by jitter.

SUMMARY OF THE INVENTION

The present invention provides an apparatus for synchronizing a first signal with a second signal which eliminates the necessity of a clock generating a high-frequency multiple of the frequency of the signal to be synchronized. Also, the present invention avoids the stability and lock up problems of the phase-locked loop.

The apparatus for synchronizing a first signal with a second signal of the present invention comprises a plurality of delay means $D_i$ as i goes from 1 to N, where N is an integer, each delay means $D_i$ having an input $I_i$ and a delay output $O_i$ for delaying a signal received at the respective input $I_i$ by an increment $\delta t$ of time and supplying the delayed signal at the respective delay output $O_i$.

The first delay means $D_1$ of the plurality of delay means is connected to receive the first signal at its input $I_1$. Each of the other delay means $D_i$, for i equal to 2 to N, are connected in series such that the respective input $I_i$ is connected to receive the delay output $O_{i-1}$ of the preceding delay means $D_{i-1}$.

A plurality of latch means $L_i$, as i goes from 1 to N, are connected to be clocked by the second signal. Each of the latch means $L_i$ latches the signal at the delay output $O_i$, respectively for each of the delay means $D_i$, in response to the second signal and supplies the latched signal at a respective latch output $Q_i$.

Output logic means, responsive to at least a subset of the plurality of delay outputs $O_i$ and plurality of latch outputs $Q_i$, for supplying essentially a phase-shifted copy of the first signal synchronized with the second signal is provided.

DETAILED DESCRIPTION

With reference to the figures, a detailed description of the present invention is provided.

Figure 1:
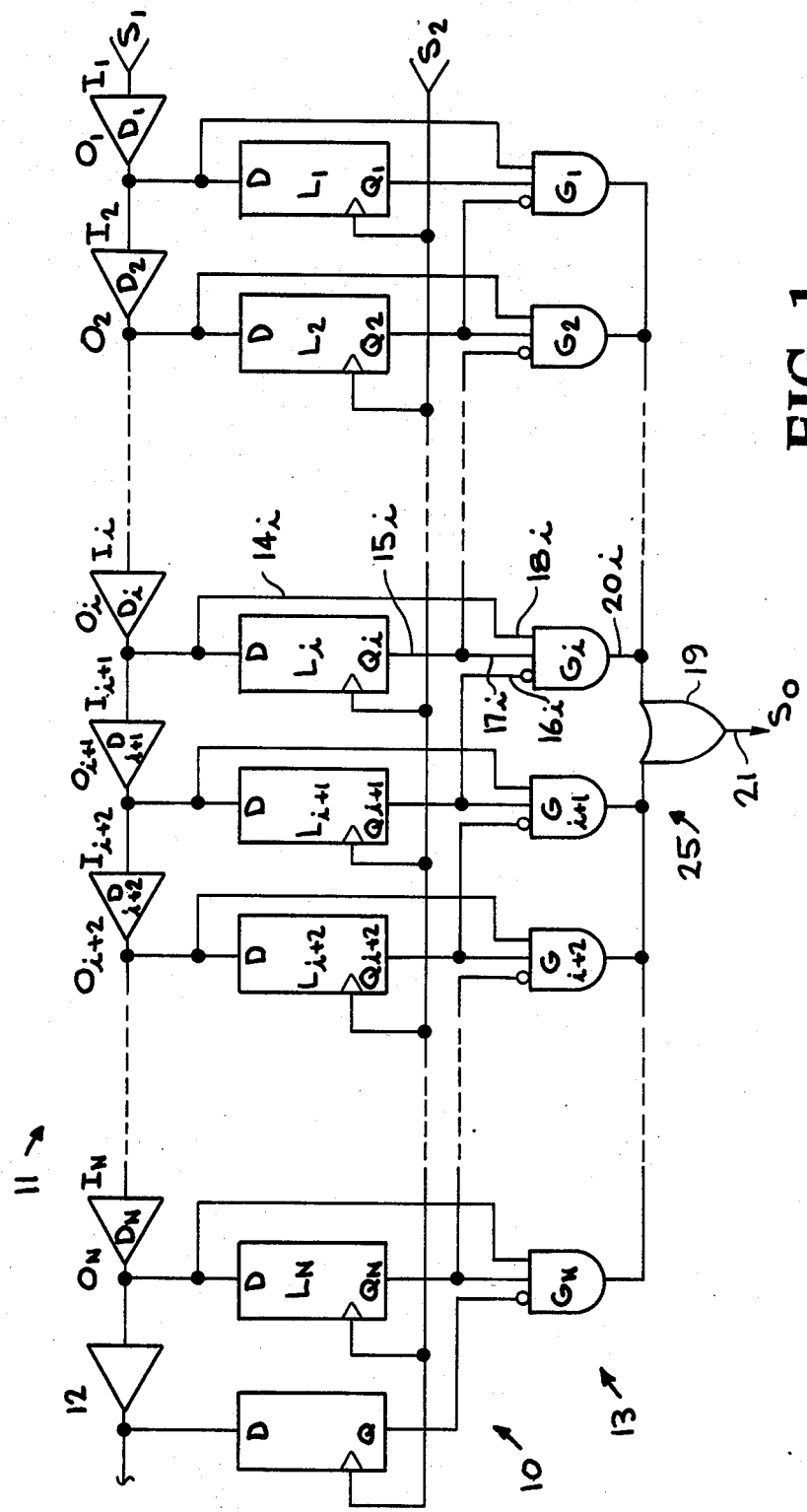
FIG. 1 is a logic diagram of one embodiment of the present invention.

FIG. 1 shows an apparatus 10 for synchronizing a first signal $S_1$ with a second signal $S_2$ by generating an output signal $S_0$ that is essentially a phase shifted copy of the first signal $S_1$ synchronized with the second signal $S_2$.

The apparatus 10 includes a delay line 11 consisting of a plurality of delay means $D_i$ as i goes from 1 to N. Each delay means $D_i$ includes an input $I_i$ and a delay output $O_i$. The delay means $D_i$ delays the signal received at its respective input $I_i$ by an increment $\delta t$ of time and supplies the delayed signal at its respective delay output $O_i$. The first delay means $D_1$ of the plurality of delay means in the delay line 11 is connected to receive the first signal $S_1$ at its input $I_1$. Each of the other delay means $D_i$, for i=2 to N, are connected in series such that the respective input $I_i$ is connected to receive the delay output $O_{i-1}$ of the preceding delay means $D_{i-1}$. Thus, the output $O_1$ of the first delay means $D_1$ is supplied to the input $I_2$ of the second delay means $D_2$. The output $O_2$ of the second delay means $D_2$ is connected to the input $I_3$ of the third delay means $D_3$ and so on. The delay means $D_i$ may be implemented with buffers having a desired progation delay so that the increment $\delta t$ time meets a particular need.

Depending on the characteristics of the first signal $S_1$ as discussed in more detail below, there may be additional delay means such as delay means 12 connected to receive the output $O_N$ from the delay means $D_N$.

A plurality of latch means $L_i$ as i goes from 1 to N are included. The latches are connected to receive respectively the delay output $O_i$ from a corresponding delay means $D_i$ as latch input, such as the D input of a D-type flipflop as shown in FIG. 1.

The second signal $S_2$ is supplied at the clock input of each of the latch means $L_i$ so that upon occurrence of the second signal $S_2$, the delay outputs $O_i$ are latched by the latch means $L_i$ and the latch means $L_i$ supply latched delay outputs at the respective latch outputs $Q_i$.

An output logic means shown generally at 13, responsive to at least a subset of the plurality of delay outputs $O_i$ and plurality of latch outputs $Q_i$ across lines $14_i$ and $15_i$, respectively, is included. The output logic means 13 supplies the output signal $S_0$ which is essentially a phase shifted copy of the first signal $S_1$ and synchronized with the second signal $S_2$.

The output logic means 13 in the embodiment shown in FIG. 1 includes a plurality of gate means $G_i$, for i=1 to N, each gate means $G_i$ having a first input $16_i$, a second input $17_i$ and a third input $18_i$ and generates a high output when the first input is low, the second input is high and the third input is high.

For detecting a rising edge as shown, each gate means $G_i$ is connected having its first input $16_i$ connected to the latch output $Q_k$, where k=i+1 in the embodiment shown in FIG. 1 but can be any integer. The second input $17_i$ is connected to receive latch output $Q_l$ where l=i in the embodiment shown but can be any integer. The third input $18_i$ is connected to the delay output $O_j$, where j=i in the embodiment shown in FIG. 1 but can be any integer. In order to detect a falling edge (not shown), k would equal i, l would equal i+1 and j would equal i or another integer.

Output means 25, connected to receive the output $20_i$ of each of the plurality of gate means $G_i$ supplies the phase shifted copy of the first signal $S_1$ as the output signal $S_0$. In the embodiment shown in FIG. 1 the output means 25 includes N-input OR-gate 19 having an output 21 and connected to receive as inputs the outputs $20_i$ from each of the plurality of gate means $G_i$ as i goes from 1 to N.

Figure 2:
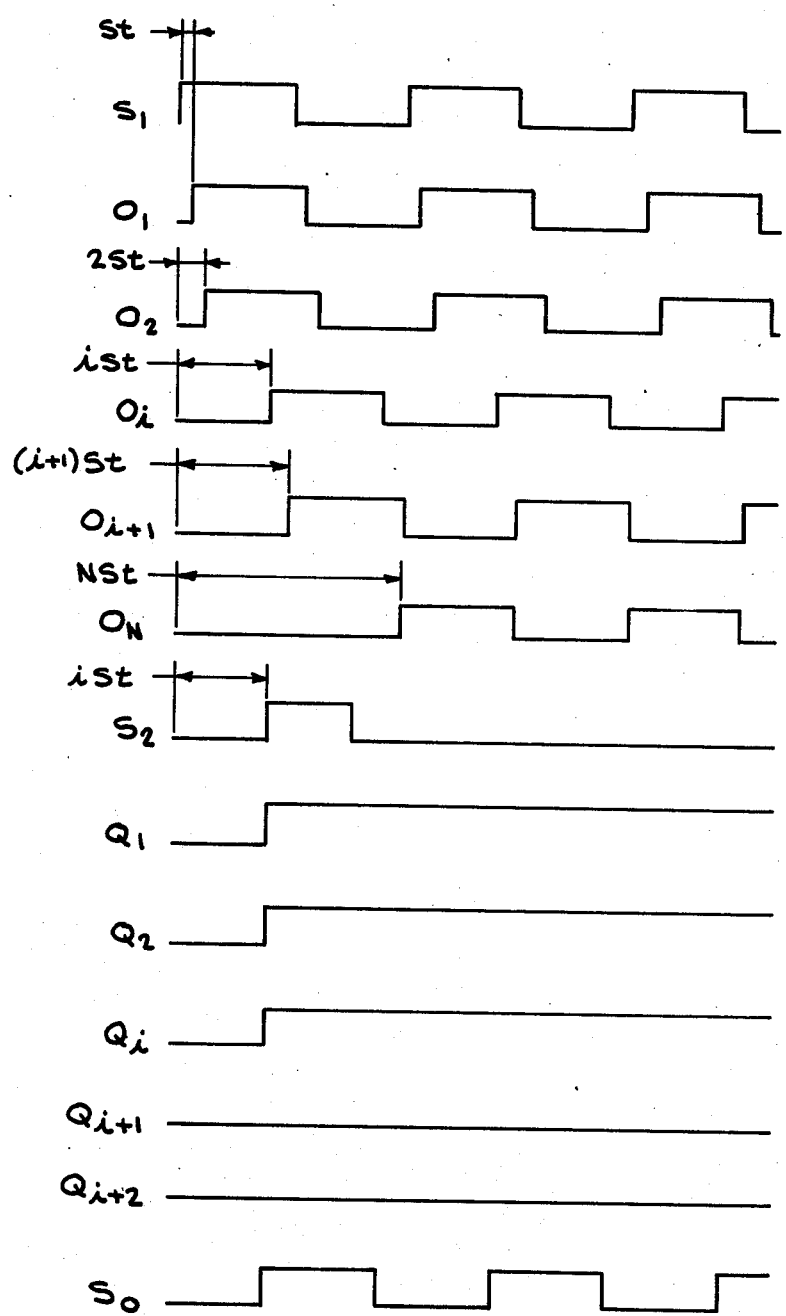
FIG. 2 is a timing diagram used in the explanation of the apparatus of FIG. 1.

The operation of the apparatus 10 shown in FIG. 1 can be understood with reference to the timing diagram of FIG. 2. In FIG. 2, the signal $S_1$ is shown as a periodic square wave such as might be generated by high frequency clock. Signal $S_1$ is supplied to the first delay means $D_1$ and the output $O_1$ as shown in FIG. 2 is a copy of the signal $S_1$ shifted in time by an amount $\delta t$. The output $O_1$ is supplied to the following input $I_2$ and the output $O_2$ of the second delay means $D_2$ is shifted in time again by $\delta t$ for a total shift of $2\delta t$.

Thus, following along the delay line 11 the output $O_i$ will be a copy of the signal $S_1$ shifted in time by an amount $i \times \delta t$, as shown in FIG. 2. Output $O_{i+1}$ will be phase shifted copy of signal $S_1$ but shifted in time by an amount $(i+1) \times \delta t$. The output $O_N$ is a copy of the signal $O_1$ but phase shifted by an amount $N \times \delta t$ as shown in FIG. 2. In the preferred embodiment, the time $N \times \delta t$ is at least as great as the period of the first signal $S_1$ so that at any time that the second signal $S_2$ may occur, the leading edge, or other characteristic of the first signal $S_1$ to be detected as discussed below, will be located among the plurality of delay outputs $O_i$.

Assume the signal $S_2$ occurs at a time $i \times \delta t$ out of sync with the signal $S_1$ as shown in FIG. 2. When the signal $S_2$ occurs, the latches $L_{i-y}$ through $L_i$ will have a high signal at their respective inputs so the latch outputs $Q_{i-y}$ through $Q_i$ will be set high upon occurrence of the signal $S_2$ where y is equal to or less than i and $y \times \delta t$ is equal to or less than the length of the high portion of the first signal $S_1$. All of the following latch outputs $Q_{i+1}$, $Q_{i+2}$ through $Q_{i+z}$ will latch a low output signal $O_{i+1}$, $O_{i+2}$ through $O_{i+z}$ causing the latch outputs $Q_{i+1}$, $Q_{i+2}$ through $Q_{i+z}$ to be low in this example where z is equal to or less than N and $z \times \delta t$ is equal to or less than the length of the low portion of the signal $S_1$.

Thus the plurality of latch outputs $Q_i$ identify the location of a characteristic of the first signal $S_1$ among the delay outputs $O_i$ upon the occurrence of the second signal $S_2$. In the embodiment shown in FIG. 2 the characteristic is the leading edge, or rising edge of the first signal $S_1$. At the time of the second signal $S_2$, the rising edge of the signal $S_1$ had propagated through i delay means, and upon occurrence of the second signal $S_2$, the plurality of latch means $L_i$ will store data identifying the location of the leading edge of the signal $S_1$ among the plurality of the delay outputs $O_i$.

The setting of the latch outputs $Q_i$ enables the gate means $G_i$ to supply the delay output $O_i$ to the OR-gate 19 and through the OR-gate 19 as the output signal $S_0$. As can be seen, the first input on line $16_i$ upon occurrence of the second signal $S_2$ will be low because the latch output $Q_{i+1}$ will be low. The second input on line $17_i$ of the gate means $G_i$ will be high because the latch output $Q_i$ will be high. The third input $18_i$ is connected to receive the delay output $O_i$ and thus supplies the delay output $O_i$ as the output to the gate $G_i$.

Only gate means $G_i$ will be enabled to pass the delay output $O_i$ through, while all other gate means will be disabled in the example shown. Thus the plurality of gate means $G_i$ operate to detect the leading edge of the first signal $S_1$ and select the delay output $O_i$ that provides the proper phase shift $i \times \delta t$ to the signal $S_1$ in order to synchronize the signal $S_1$ with the second signal $S_2$. The selected delay output $O_i$ is supplied in the output signal $S_0$.

The output logic means 13 can be adapted to identify a wide variety of characteristics, the location of which will be identified by the plurality of latch outputs $Q_i$. For instance, many digital signals include start characters. The output logic means 13 could thus be adapted to identify the location of the start character among the latch outputs $Q_i$ and select and supply the appropriate delay output $O_i$ as the output signal $S_0$ such that the output signal $S_0$ synchronizes the start character or other characteristic of the first signal $S_1$ with the occurrence of the second signal $S_2$.

The embodiment shown in FIG. 1 is operable in environments where the risk of metastable latch outputs $Q_i$ is low. Further, the embodiment shown in FIG. 1 will generate an output signal $S_0$ having a first cycle which is slightly distorted due to delays in the latch means $L_i$ and the output logic means. For preventing problems due to metastable latch outputs and for obtaining maximum fidelity in the first cycle of the output signal $S_0$, the embodiment shown in FIG. 3 can be used.

Problems of metastable latch outputs occurs because when the second signal $S_2$ clocks the plurality of latch means $L_i$, there is a possibility that the delay output $O_i$ will be in transition thus causing an indeterminate input at the D-input to the latch means $L_i$. In this situation the latch output $Q_i$ will be indeterminate but will settle at either a high or a low value.

The propagation delay is important only when it is desired to have maximum fidelity in the first cycle of the output signal $S_0$. For the purposes of the embodiment of FIG. 3, it is assumed that the propagation delay through the latch means $L_i$ is approximately $2 \times \delta t$.

Figure 3:
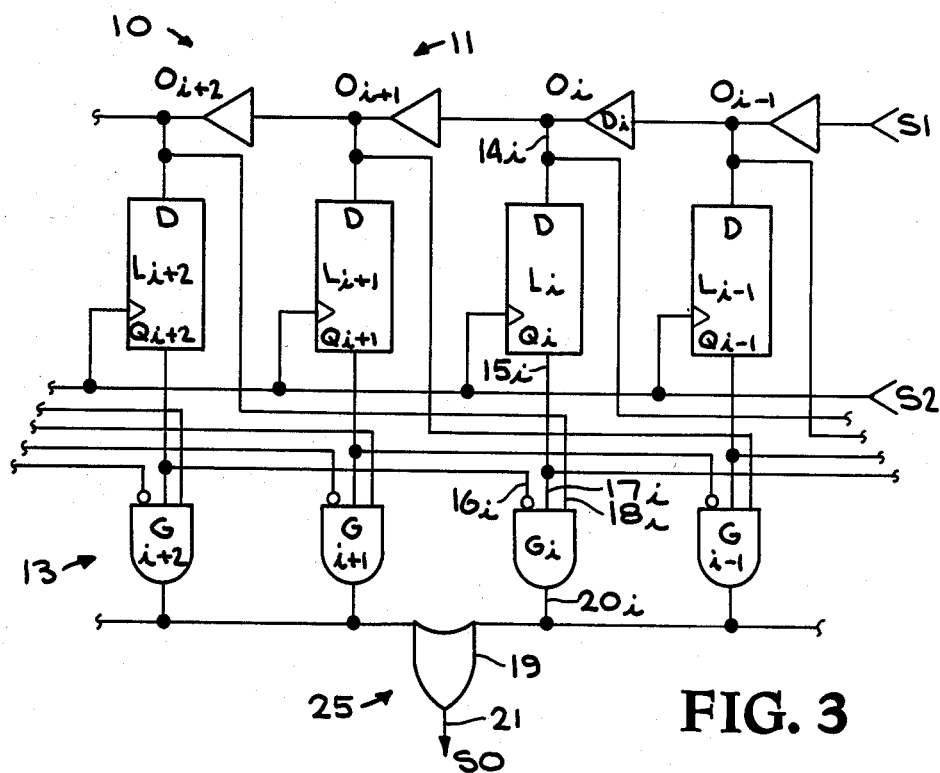
FIG. 3 is a logic diagram of an alternate embodiment of the present invention.

FIG. 3 shows an apparatus 10 for synchronizing a first signal $S_1$ with a second signal $S_2$ by generating an output signal $S_0$ that is essentially a phase-shifted copy of the first signal $S_1$ synchronized with the second signal $S_2$. The apparatus 10 includes a delay line 11. The delay line 11 includes a plurality of delay means $D_i$ as i goes from 1 to N, only a portion of which are shown in FIG. 3.

Each of the delay means $D_i$ generates a delay output $O_i$ which is essentially a copy of the input to the delay means $D_i$ phase shifted by an increment of time $\delta t$.

Each of the delay outputs $O_i$ is supplied as an input to one of a plurality of latch means $L_i$, respectively. The latch means $L_i$ are connected to be clocked by the second signal $S_2$. The latch outputs $Q_i$ are set after a propagation delay of approximately $2\delta t$, in this example, after occurrence of the second signal $S_2$. In the embodiment shown in FIG. 3, the latch means $L_i$ are implemented using D-type flipflops.

The apparatus 10 includes an output logic means shown generally at 13, responsive to at least a subset of the plurality of delay outputs $O_i$ and the plurality of latch outputs $Q_i$ across lines $14_i$ and $15_i$, respectively. The output logic means 13 supplies an output signal $S_0$ which is essentially a phase-shifted copy of the first signal $S_1$ and synchronized with the second signal $S_2$.

The output logic means 13 in the embodiment shown in FIG. 3 includes a plurality of gate means $G_i$, for i=1 to N, only a portion of which are shown in FIG. 3. Each gate means $G_i$ has a first input $16_i$, a second input $17_i$ and a third input $18_i$, and generates a high output when the first input is low, the second input is high and the third input is high.

The three inputs are connected as discussed above with reference to FIG. 1 such that its first input is connected to the latch output $Q_k$, where k=i+2. The second input $17_i$ is connected to receive latch output $Q_l$ where l=i. The third input $18_i$ is connected to the delay output $O_j$ where j=i+2 in the embodiment shown in FIG. 3.

The output of each of the gates $G_i$ is supplied to an output means 25, connected to receive each of the outputs from the plurality of gate means $G_i$, for supplying the phase-shifted copy of the first signal $S_1$ as the output $S_0$. In the embodiment shown in FIG. 3 the output means 25 includes an N-input OR-gate 19, having an output 21 and connected to receive as inputs the outputs from the plurality of gate means $G_i$, as i goes from 1 to N.

Figure 4:
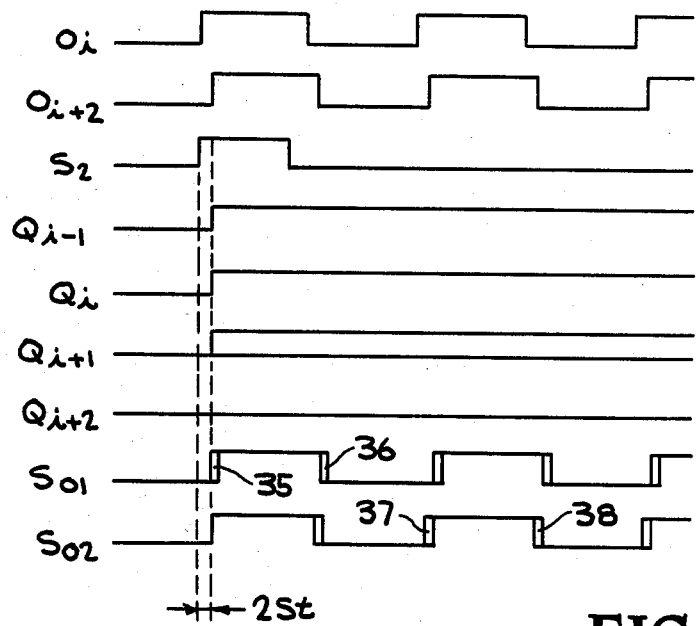
FIG. 4 is a timing diagram used in the explanation of the apparatus of FIG. 3.

The operation of the apparatus 10 shown in FIG. 3 can be understood with reference to the timing diagram of FIG. 4. As shown in FIG. 4, the delay output $O_i$ is a phase-shifted copy of the first signal $S_1$. The delay output $O_{i+2}$ is a phase-shifted copy of the delay output $O_i$ having a shifted phase of approximately $2 \times \delta t$.

Assuming the second signal $S_2$ occurs at the time the delay output $O_i$ changes from low to high, then the plurality of latch means $L_i$ will latch the delay outputs $O_i$ such that the leading edge of the first signal $S_1$ is identified as located at delay output $O_i$. Thus, the latch output $Q_{i-1}$ after the propagation delay of $2 \times \delta t$ will be set high. The latch output $Q_i$ after the propagation delay will be set high. However, in case the delay output $O_{i+1}$ happens to be in transition upon the occurrence of the second signal $S_2$, then the latch output $Q_{i+1}$ will be indeterminate and eventually resolve to be either high or low as indicated in FIG. 4. Because of the propagation delay of the delay means $O_i$, the latch means $L_{i+2}$ will latch a low signal so that the latch output $Q_{i+2}$ will be low.

The embodiment shown in FIG. 3 accounts for the possibility that the latch output $Q_{i+1}$ occurring close to the leading edge of the first signal $S_1$ among the delay outputs $O_i$ will be metastable. This is accomplished by connecting the first input $16_i$ of the gate means $G_i$ to the latch output $Q_{i+2}$. In this manner if the leading edge of the first signal $S_1$ is occurring at the delay output $O_i$, then the gate means $G_i$ will be enabled regardless of the possibility of metastable state of the latch output $Q_{i+1}$.

However, this also allows a second gate means, either $G_{i-1}$ or $G_{i+1}$ to be enabled. The consequences of this are discussed below.

The embodiment of FIG. 3 further provides for maximum fidelity of the output signal $S_0$ in the first cycle of the output signal $S_0$ by accounting for propagation delays in the latch means $L_i$. As discussed above, the propagation delay of $2 \times \delta t$ is assumed for the embodiment of FIG. 3. Thus, in order to assure that the first cycle of the output signal $S_0$ is as close to a true copy of the first signal $S_1$ as possible, the third input $18_i$ to the gate means $G_i$ is connected to receive the delay output $O_{i+2}$ for the entire series. for embodiments in which the latch means has a propagation delay that is close to an integer multiple X of the time increment $\delta t$, then the third input $18_i$ of the gate means $G_i$ would be connected to receive the delay output $O_{i+x}$.

The output signal $S_0$ which results from the embodiment of FIG. 3 is shown in the two possibilities labeled $S_{01}$ and $S_{02}$ in FIG. 4.

In the first case, the output signal $S_{01}$ is shown which would be generated in the event that the output $Q_{i+1}$ settles at a high value. As shown, after the propagation delay of $2 \times \delta t$, the gate $G_i$ and the gate $G_{i+1}$ will be enabled to supply the delay outputs $O_{i+2}$ and $O_{i+3}$ (not shown) to the output OR-gate 19. Thus the signal $S_{01}$ in the first case will be the OR of delay output $O_{i+2}$ and delay output $O_{i+3}$. Thus the leading edge 35 of the output signal $S_{01}$ will be determined by the delay output $O_{i+2}$ while the falling edge 36 will be determined by the delay output $O_{i+3}$. This results in a slight distortion lengthening the high portion of the output signal $S_{01}$ of one delay increment $\delta t$ at falling edge 36. However this is acceptable in embodiments in which $\delta t$ is very small with respect to the frequency of the first signal $S_1$.

In the case in which the latch output $S_{i+1}$ settles at a low value, the output signal resulting is shown as $S_{02}$ in FIG. 4. Upon the settling of the latch output $Q_{i+1}$ to a low value, the gate means $G_{i-1}$ and the gate means $G_i$ will be enabled to supply at their respective ouputs $20_{i-1}$ and $20_i$ the delay outputs $O_{i+1}$ and $O_{i+2}$ as inputs to the OR-gate 19. Thus the output signal $O_2$ will be the OR of delay outputs $O_{i+1}$ and $O_{i+2}$ so that the leading edge 37 in the second cycle of the output signal $S_{02}$ will be determined by the delay output $O_{i+1}$, while the falling edge 38 of the output signal $S_{02}$ will be determined by the delay output $O_{i+2}$. Because of the propagation delay of the latch means $L_i$, the leading edge of the output signal $S_{02}$ in the first cycle corresponds with the leading edge of the delay output $O_{i+2}$. Because both delay outputs $O_{i+1}$ and $O_{i+2}$ are tapped, the high time in the signal $S_{02}$ will be increased by an amount $\delta t$ at the leading edge. This distortion is tolerable in systems in which the increment $\delta t$ is small with respect to the frequency of the first signal $S_1$.

In the embodiments shown in FIG. 1 and FIG. 3, when the characteristic of the first signal $S_1$ to be detected occurs in two locations among the delay outputs $O_i$, then the first signal will be tapped at both locations. This will occur when two leading edges in the embodiments shown occur within the time interval $N \times \delta t$ or the length of the delay line 11. When the first signal $S_1$ is a clock or other waveform that repeats in each cycle, then the output signal $S_0$ may distort in this instance by the resolution increment $\delta t$ being added to the high time of the output signal $S_0$. If the first signal $S_1$ is not a repetitive waveform, or one in which the mark to space ratio changes substantially from cycle to cycle, then the length of the delay line 11 should be adjusted to prevent the occurrence of two leading edges within the delay line, or the output logic means 13 should be adapted to detect the first occurrence.

In summary, the present invention uses an asynchronous digital delay line 11 and a plurality of latch means $L_i$ to capture a "snapshot" of the first signal $S_1$ and then replay the first signal $S_1$ in a phase determined by the "snap shot" which is locked to the synchronizing second signal $S_2$.

The resolution of the apparatus 10 according to the present invention is determined by the delay increment $\delta t$ of each of the delay means $D_i$. With present ECL technology, buffers suitable for use as the delay means $D_i$ can be fashioned having a propagation delay of about one nanosecond. The prior art is unable to accomplish resolution approaching that of the present invention without the use of a 1,000 megahertz clock.

The foregoing description of a preferred embodiment of the present invention has been presented for the purposes of illustration and description. It is not intended to be exhaustive or to limit the invention to the precise form disclosed and obviously many modifications and variations are possible in light of the above teaching. The embodiments that identify a leading edge of the first signal and replay that signal beginning with that leading edge in synchronization with the second signal were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus for synchronizing a first signal with a second signal comprising:
   a plurality of delay means $D_i$, where i goes from 1 to N and N is an integer, each delay means $D_i$ having an input $I_i$ and a delay output $O_i$ for delaying a signal received at the respective input $I_i$ by an increment $\delta t$ of time and supplying the delayed signal at the respective delay output $O_i$;
   one delay means $D_1$ of the plurality delay means having an input $I_1$ connected to receive the first signal and each of the other delay means $D_i$ for i=2 to N being connected in series therewith;
   a plurality of latch means $L_i$ where i goes from 1 to N, connected in communication with the second signal and the plurality of delay outputs $O_i$;
   each latch means $L_i$ for latching the signal at the delay output $O_i$ respectively, in response to the second signal and for supplying the latched signal at latch output $Q_i$, wherein a subset of the plurality of latch outputs $Q_i$ identify a characteristic of the first signal;
   means for detecting the characteristic of the first signal; and
   selecting means, responsive to the means for detecting the characteristic, for selecting at least one of the plurality of delay outputs $O_i$ and supplying the at least one selected delay output $O_i$ as essentially a phase-shifted copy of the first signal synchronized at the characteristic with the second signal.

2. The apparatus of claim 1, wherein the first signal has a leading edge and the characteristic detected is the location of the leading edge of the first signal among the latch outputs $Q_i$.

3. The apparatus of claim 1, wherein the first signal includes a start character and the characteristic detected is the location of the start character among the latch outputs $Q_i$.

4. An apparatus for synchronizing a first signal with a second signal comprising:
   a plurality of delay means $D_i$, where i goes from 1 to N and N is an integer, each delay means $D_i$ having an input $I_i$ and a delay output $O_i$ for delaying a signal received at the respective input $I_i$ by an increment $\delta t$ of time and supplying the delayed signal at the respective delay output $O_i$;
   one delay means $D_1$ of said plurality of delay means having an input $I_1$ connected to receive the first signal and each of the other delay means $D_i$ for i=2 to N being connected in series therewith;
   a plurality of latch means $L_i$ where i goes from 1 to N, connected in communication with the second signal and the plurality of delay outputs $O_i$, each latch means $L_i$ for latching the signal at the delay output $O_i$, respectively, in response to the second signal and for supplying the latched signal at latch output $Q_i$;
   a plurality of gate means $G_i$ for i=1 to N, each gate means $G_i$ having a first input, a second input, and a third input, for generating a gate output equal to the third input when the first input is low and the second input is high;
   each gate means $G_i$ having its first input connected to latch output $Q_k$, where k is an integer, its second input connected to receive latch output $Q_l$ where l is an integer, and its third input connected to delay output $O_j$, where j is an integer; and
   output means, connected to receive the gate output of each of the plurality gate means $G_i$ for supplying essentially a phase-shifted copy of the first signal in synchronization with the second signal as an output signal.

5. The apparatus of claim 4, wherein:
   said output means includes an N-input OR-gate having an output and connected to receive the gate outputs from each of the plurality of gate means $G_i$ as i goes from 1 to N for supplying the phase-shifted copy of the first signal at the OR-gate output.

6. The apparatus of claim 4, wherein:

each of the latch means $L_i$ has a propagation delay, the propagation being close to $\delta t$ times an integer x; and $j = i + x$.

7. The apparatus of claim 4, wherein: $l = i$, $k = i + 1$ and $j = 1$.

8. The apparatus of claim 4, wherein: $l = i$, $k = i + 2$ and $j = i + 2$.

9. The apparatus of claim 4, wherein: $j = i$; $k = i$ and $l = i + 1$.

* * * * *